United States Patent
Xue et al.

(10) Patent No.: US 9,412,684 B2
(45) Date of Patent: Aug. 9, 2016

(54) TOP EXPOSED SEMICONDUCTOR CHIP PACKAGE

(71) Applicant: Alpha and Omega Semiconductor Incorporated, Sunnyvale, CA (US)

(72) Inventors: Yan Xun Xue, Los Gatos, CA (US); Yueh-Se Ho, Sunnyvale, CA (US); Hamza Yilmaz, Saratoga, CA (US); Anup Bhalla, Santa Clara, CA (US); Jun Lu, San Jose, CA (US); Kai Liu, Mountain View, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 45 days.

(21) Appl. No.: 14/056,047

(22) Filed: Oct. 17, 2013

(65) Prior Publication Data

US 2014/0035116 A1    Feb. 6, 2014

Related U.S. Application Data

(62) Division of application No. 12/968,159, filed on Dec. 14, 2010, now Pat. No. 8,586,414.

(51) Int. Cl.
*H01L 23/495* (2006.01)
*H01L 21/56* (2006.01)
*H01L 23/31* (2006.01)
*H01L 23/00* (2006.01)

(52) U.S. Cl.
CPC ........ *H01L 23/49562* (2013.01); *H01L 21/561* (2013.01); *H01L 23/3107* (2013.01); *H01L 23/49524* (2013.01); *H01L 24/40* (2013.01); *H01L 24/73* (2013.01); *H01L 24/48* (2013.01); *H01L 2224/16245* (2013.01); *H01L 2224/32245* (2013.01); *H01L 2224/40095* (2013.01); *H01L 2224/40137* (2013.01); *H01L 2224/40139* (2013.01); *H01L 2224/40245* (2013.01); *H01L2224/40247* (2013.01); *H01L 2224/48247* (2013.01); *H01L 2224/73221* (2013.01); *H01L 2224/73263* (2013.01); *H01L 2924/00013* (2013.01); *H01L 2924/014* (2013.01); *H01L 2924/1305* (2013.01); *H01L 2924/1306* (2013.01); *H01L 2924/13091* (2013.01); *H01L 2924/181* (2013.01); *H01L 2924/1815* (2013.01); *H01L 2924/3011* (2013.01); *H01L 2924/30107* (2013.01)

(58) Field of Classification Search
CPC .............. H01L 23/49575; H01L 23/49562; H01L 2224/40247; H01L 2224/73221; H01L 2224/3011; H01L 2224/73263; H01L 2224/40137; H01L 2224/48247; H01L 2224/32245; H01L 2224/16245; H01L 2924/1305; H01L 2924/1306; H01L 2924/181; H01L 2924/30107; H01L 23/49524
USPC ......................................................... 257/728
See application file for complete search history.

(56) References Cited

U.S. PATENT DOCUMENTS

| | | | | |
|---|---|---|---|---|
| 6,459,147 | B1 * | 10/2002 | Crowley et al. | 257/692 |
| 6,630,726 | B1 * | 10/2003 | Crowley | H01L 23/3107 257/666 |
| 2004/0063240 | A1 * | 4/2004 | Madrid | H01L 23/49524 438/106 |
| 2006/0110856 | A1 * | 5/2006 | Kasem | H01L 23/49524 438/123 |
| 2007/0085201 | A1 * | 4/2007 | Bauer et al. | 257/728 |
| 2008/0036078 | A1 * | 2/2008 | Herbsommer et al. | 257/727 |
| 2012/0025360 | A1 * | 2/2012 | Xue | H01L 23/49524 257/676 |

OTHER PUBLICATIONS

"Emerging MOSFET Packaging Technologies and Their Thermal Evaluation", authors by Xuejun Fan, Shatil Hague; published in 2002 IEEE.*
"Enabling Cu Wire in 3D Stack Package QFN", authors by Ruby Anne M. Camenforte, Ray Fedrick de Asis, *Mahmud Chowdhury; published in 2009 IEEE.*

* cited by examiner

*Primary Examiner* — Bilkis Jahan
*Assistant Examiner* — Nga Doan
(74) *Attorney, Agent, or Firm* — Chein-Hwa S. Tsao; Chen-Chi Lin (57) ABSTRACT

A semiconductor package and it manufacturing method includes a lead frame having a die pad, and a source lead with substantially a V groove disposed on a top surface. A semiconductor chip disposed on the die pad. A metal plate connected to a top surface electrode of the chip having a bent extension terminated in the V groove in contact with at least one of the V groove sidewalls.

12 Claims, 11 Drawing Sheets

TOP EXPOSED SEMICONDUCTOR CHIP PACKAGE

CROSS-REFERENCE TO RELATED APPLICATIONS

This patent application is a Divisional Application of a co-pending application Ser. No. 12/968,159 filed on Dec. 14, 2010. Thus, this application claims the Priority Date of the co-pending application Ser. No. 12/968,159. Also, the Disclosures made in the co-pending application Ser. No. 12/968,159 are hereby incorporated by reference.

TECHNICAL FIELD

The invention relates to a power semiconductor device, in particular to a top exposed package with favorable electrical properties and heat dispersion and assembly method thereof.

BACKGROUND OF INVENTION

Major considerations in the packaging of semiconductor devices include high thermal dissipation, low parasitic inductance, low electrical resistance between the semiconductor device and the circuit environment, good reliability in terms of thermal cycling and thermal shock/fatigue, and minimal consumption of circuit board space. Interconnection of the active components is often facilitated by clip bonding to eliminate or reduce parasitic resistance and inductance. The clips are usually bonded to the chips one by one in the manufacturing process that requires high precision alignment thus increasing assembly cost. Continuous improvement of the chip packaging technology is required to further improve the various performance parameters of the device and assembly cost.

BRIEF DESCRIPTION OF THE DRAWINGS

The embodiments of the present invention will be more thoroughly described herein with reference to the accompanying drawings, which, however, are only for descriptive and illustrative purposes and do not constitute a restriction on the scope of the present invention.

DETAILED DESCRIPTION OF THE INVENTION

Figure 1:
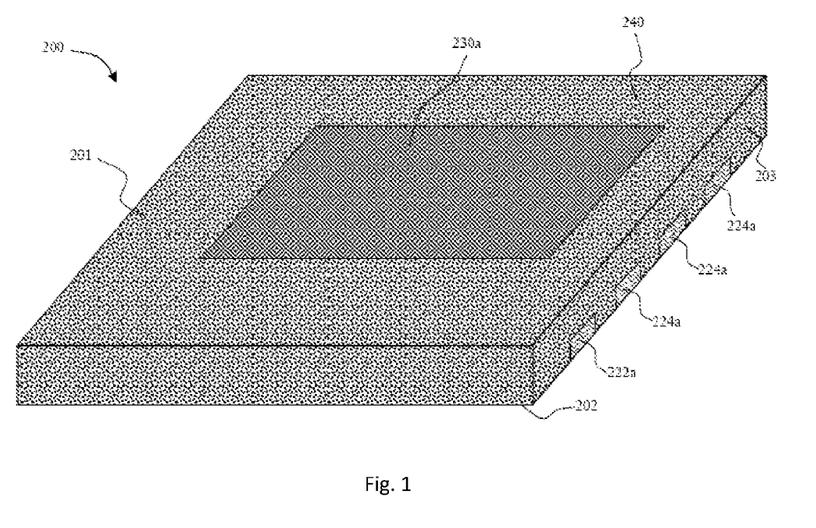
FIG. 1 is a top perspective view of a package in accordance with first embodiment of the present invention.
Figure 2:
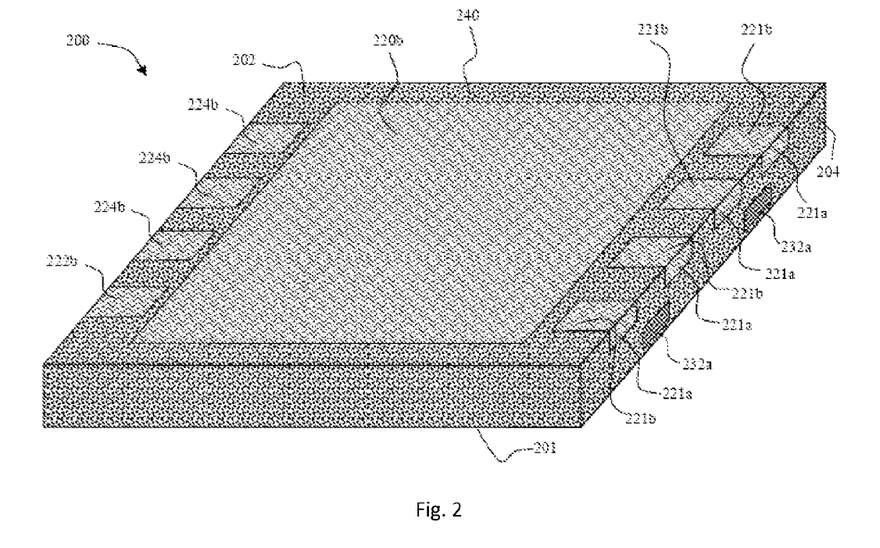
FIG. 2 is a perspective bottom view of the package in accordance with the first embodiment of the present invention.
Figure 3:
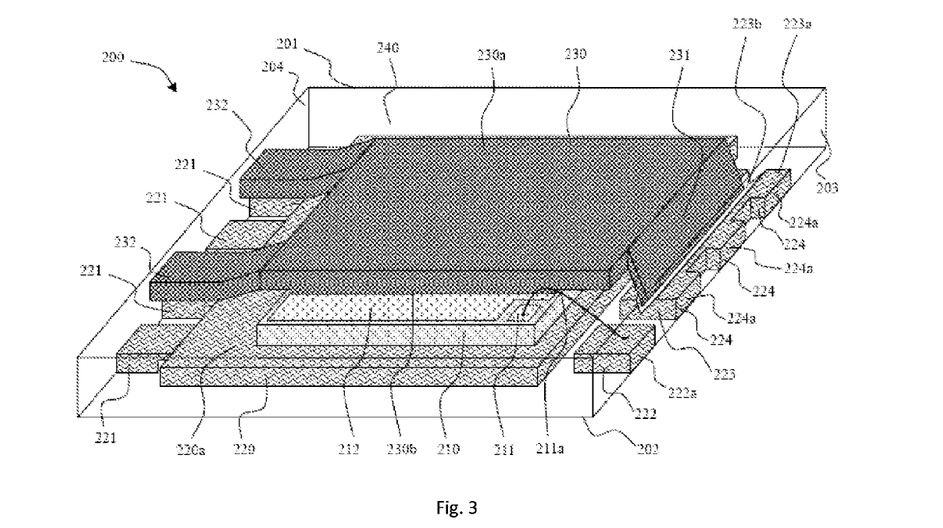
FIG. 3 is a perspective structure diagram of the package in accordance with the first embodiment of the present invention.
Figure 4:
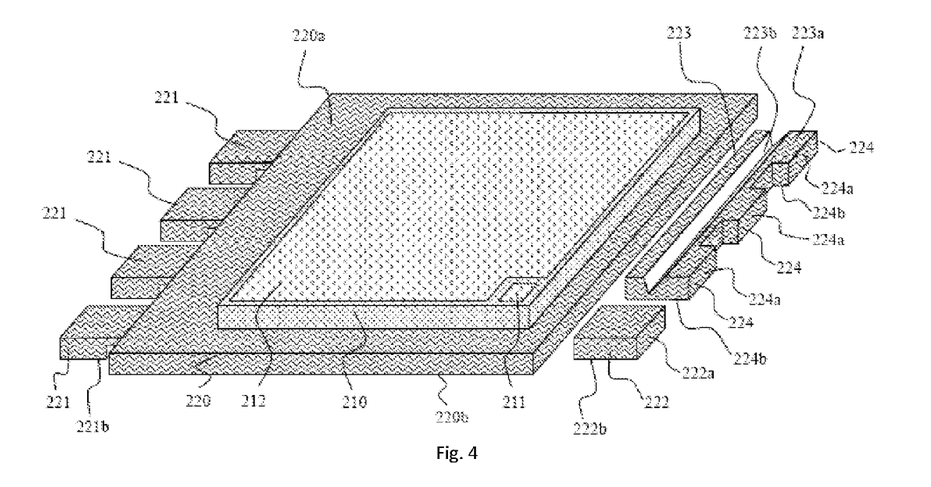
FIG. 4 is a structure diagram of a lead frame and a chip attached on the lead frame in accordance with the first embodiment of the present invention.

In accordance with the claims of the present invention and contents disclosed by the present invention, the technical features of the present invention are described in detail as below:

First Embodiment:

Referring to FIGS. 1 to 4, a semiconductor package 200 comprises a lead frame 220, a semiconductor chip and an encapsulation body 240. A top face 230a of a metal plate 230 is exposed out from top face 201 of plastic package body 240 as shown in top view of package FIG. 1 and structure diagram FIG. 3. A bottom face 220b of lead frame 220 is exposed out from bottom face 202 of plastic package body 240 as shown in bottom view of package in FIG. 2. Referring to FIG. 4 showing the chip attached on the lead frame, a plurality of leads are arranged around die pad 220a, including source lead 223, gate lead 222 and drain leads 221. Drain leads 221 are connected with die pad 220a. A groove 223b is formed from a top face of the source lead 223. In one embodiment, the groove has a V-shaped structure with two sidewalls terminated on the top surface of the source lead. In another embodiment the V groove has symmetric sidewalls. The bottom of chip 210 is attached to a top surface of die pad 220a of the lead frame 220 by conductive materials (not shown) such as solder pastes or silver epoxy. In one embodiment, the chip 210 as shown by FIG. 4 is a metal-oxide-semiconductor field-effect transistor (MOSFET) having a vertical device structure comprising a gate metal layer 211 constituting a gate electrode of the chip 210 is disposed on the top of the chip 210. Also, a source metal layer 212 constituting a source electrode of the chip 210 is disposed on the top of chip 210. The gate metal layer 211 and source metal layer 212 are insulated from each other by a passivation layer. A drain electrode of chip 210 is disposed on the bottom of chip 210.

In FIG. 3, metal plate 230 is provided with a bent extension structure 231, the bottom 230b of the metal plate 230 is bonded with the source metal layer 212 disposed on the top of the chip 210 by conductive materials such as the solder paste or silver epoxy type (not shown) and the bent extension 231 terminates inside the groove 223b disposed on the source lead 223. The bent extension 231 can be bonded with the source lead 223 by conductive materials such as solder paste or silver epoxy type (not shown) disposed in the groove 223b to enhance the electrical contact performance between bent extension 231 and source lead 223. In one embodiment, the bent extension 231 directly contacts at least one sidewall of the groove. A bonding wire 211a electrically connects gate metal layer 211 with gate lead 222 bonding wire.

In FIGS. 1 to 4, the plastic package body 240 formed from solidified epoxy molding compound is used for plastic packaging and encapsulating the chip 210, lead frame 220, metal plate 230 and bonding wire 211a and also the plurality of leads including the source lead 223, gate lead 222 and drain leads 221. In one embodiment the source lead 223 is provided with a plurality of source pins 224; wherein, the bottoms 224b of two adjacent source pins 224 are isolated from each other and are exposed out from the bottom 202b of the plastic package body 240 and the bottom 222b of the gate lead 222 and bottoms 221b of the drain leads 221 are both exposed out from the bottom 202b of the plastic package body 240. In another embodiment a side surface 224a of the source pin 224 and a side surface 222a of the gate lead 222 are exposed on side surface 203 of the plastic package body 240, side surface 221a of drain lead 221 is exposed on the side opposite to side surface 203 on plastic package body 240. The size and thickness of the plastic package body 200 can be effectively maintained small as no leads extend out from plastic package body 240. The bottom 220b of the lead frame 220 soldered on the bonding leads of a PCB with the SMT technique serves as a heat dissipation channel of chip 210 and the top 230a of the metal plate 230 is exposed and thus can also serve as a channel for the chip 210 to dissipate heat. As inside the package 200 the conductive paths between chip 210 and the plurality of leads around the lead frame 220 are short and the parasitic inductance and wiring resistance inside the package 200 are both reduced, the package 200 can provide excellent electrical properties.

Figure 5:
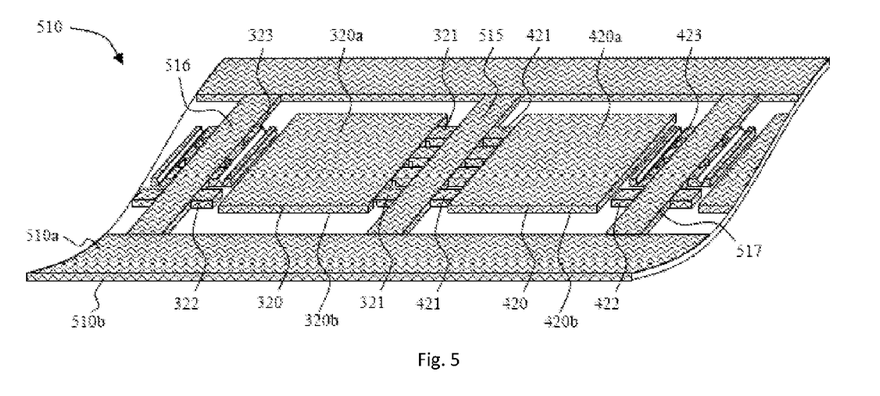
FIG. 5 is a schematic diagram of a lead frame array for the package in accordance with a first embodiment of the invention.

FIGS. 5 to 15 provide the process of making the semiconductor package 200. Referring to FIGS. 5, a lead frame array 510 comprises a plurality of chip mounting units 520' as that shown in FIGS. 7 and 8. Each chip mounting unit 520' consists of a first lead frame 520, a second lead frame 532, each includes a die pad 320 and 420 with a plurality of leads around the first die pad 320 and a plurality of leads around the second die pad 420; wherein, the leads of the first lead frame comprise a first gate lead 322, a first source lead 323 and a plurality of first drain leads 321. The first drain leads are all connected with the first die pad 320; the leads of the second lead frame comprise a second gate lead 422, a second source lead 423 and a plurality of second drain leads 421. The second drain leads are connected with the second die pad 420. The first lead frame and the second lead frame are disposed next one another forming mirror image of each other connecting to the lead frame array through tie bars 515, 516 and 517. Therefore, the first and second gate leads 322 and 422 have the same structures and are mirror symmetrical to each other, the first and the second source leads 323 and 423 have the same structures and are mirror symmetrical to each other, each first drain leads 311 and the corresponding second drain leads 421 have the same structures and are mirror symmetrical to each other and the first and second die pads 320 and 420 have the same structures and are mirror symmetrical to each other.

Figure 6:
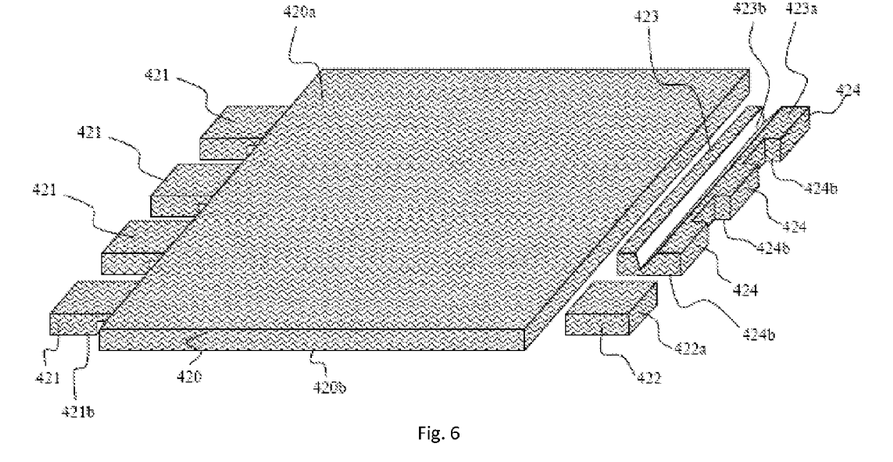
FIG. 6 is a structure diagram of a lead frame unit.
Figure 7:
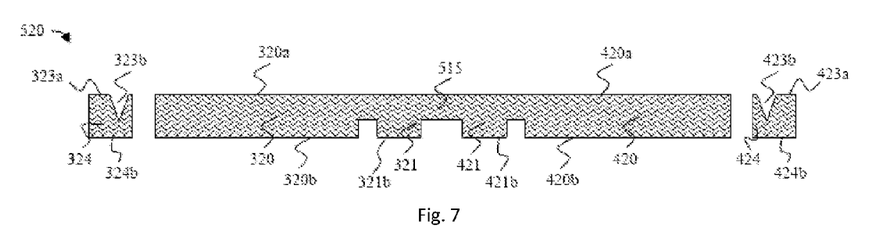
FIGS. 7-15 are schematic diagrams illustrating the manufacturing process flows of the package in accordance with the first embodiment of the present invention.
Figure 8:
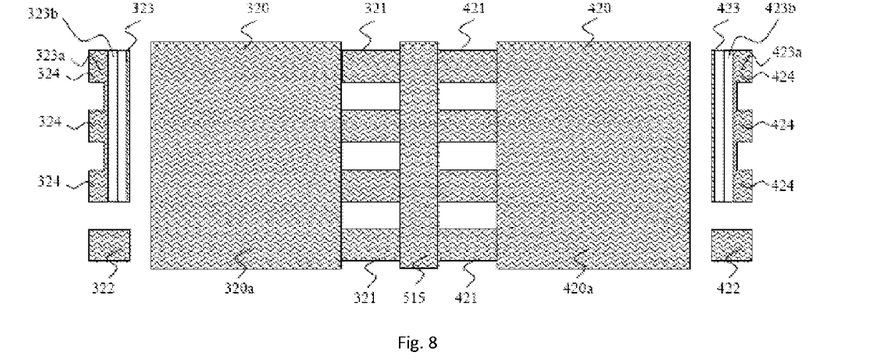

FIG. 6 shows the second lead frame 532 with the structures of the plurality of the leads around the second die pad 420, FIG. 7 is a schematic cross section of the first and second lead frame and FIG. 8 is a schematic top view of the first and second lead frame. In FIG. 6, the second source lead 423 is provided with a plurality of source pins 424 and a second groove 423b having substantially a V-shaped structure disposed on the top face 423a of the second source lead 423; wherein, the bottoms 424b of two adjacent second source pins 424 are separated from each other. Similarly, as in the first lead frame 520 respective parts disposed on both sides of the uncut tie bar 515 have the same structures and are mirror symmetrical to each other, as shown in FIGS. 7 and 8, the first source lead 323 is provided with a plurality of first source pins 324 and a first groove 323b having substantially a V-shaped structure is disposed on a top face 323a of the first source lead 323; wherein, the bottoms 324b of two adjacent first source pins 324 are separated from each other.

In FIGS. 5 and 8, the top face 320a of the first die pad 320 and the top face 420a of the second die pad 420 are disposed at the front surface 510a of the lead frame 510 and the bottom face 320b of the first die pad 320 and the bottom face 420b of the second die pad 420 are disposed at a back surface 510b of the lead frame 510. Typically, the lead frame 510 is provided with a thin film (not shown) bonded on its back surface 510b and the bottom 320b of the first die pad 320 and the bottom 420b of the second die pad 420 are covered by the thin film to protect them from being polluted or damaged during packaging process. In FIGS. 7 and 8, the bottoms 424b of the second source pins 424, the bottoms 324b of the first source pins 324, the bottom of the first gate lead 322 (not shown), the bottoms 321b of the first drain leads 321, the bottoms 421b of the second drain leads 421, the bottom of the second gate lead 422 (not shown), the bottom 320b of the first die pad 320 and the bottom 420b of the second die pad 420 are coplanar, that is, they are also attached to the thin film on the back surface 510b of the lead frame 510.

Figure 9:
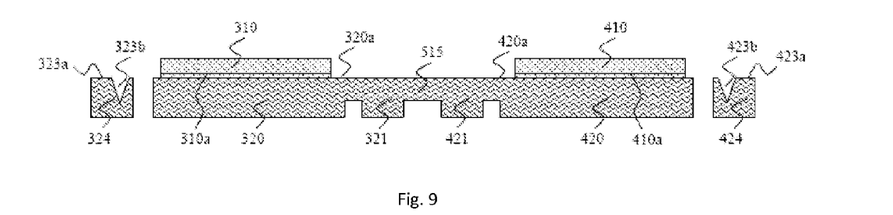
Figure 10:
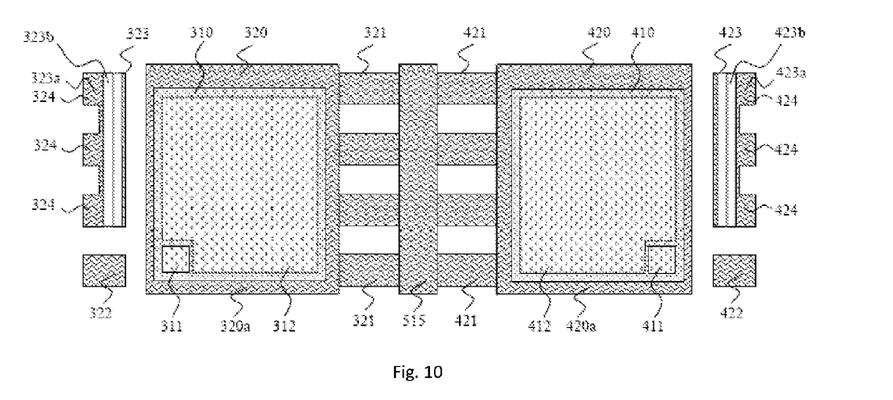

Referring to FIG. 9, a die attach process is implemented. A first chip 310 is bonded to the top face 320a of the first die pad 320 using a conductive adhesive material 310a; a second chip 410 is bonded to the top face 420a of the second die pad 420 by using a conductive adhesive material 410a. FIG. 10 is a schematic top view of the chip mounting unit with die attach completed. In FIGS. 9 and 10, both the first chip 310 and second chip 410 are vertical devices with top source and bottom drain. A first source metal layer 312 on the top face of first chip constitutes a source electrode of the first chip 310 and the bottom of the first chip 310 which is attached to the top face 320a of the first die pad 320 constitutes a drain electrode of the first chip 310. A second source metal layer 412 on the top face of second chip constitutes a source electrode of the second chip 410 and the bottom of the second chip 410 which is attached to the die pad on the top 420a of the second die pad 420 constitutes the drain electrode of the second chip 410. A lead bonding pad comprising a first gate metal layer 311 constituting a gate electrode of the first chip 310 is disposed on the top of the first chip 310 and a lead bonding pad comprising a second gate metal layer 411 constituting a gate electrode of the second chip 410 is disposed on the top of the second chip 410.

Both the first and second chips 310 and 410 maybe metal-oxide-semiconductor field-effect transistors (MOSFET) with identical parameters but with mirror symmetrical layout. In the die attach process, the first chip 310 attached to the top face 320a of the first die pad 320 forms a mirror image to the second chip 410 attached to the top face 420a of the second die pad 420.

Figure 11:
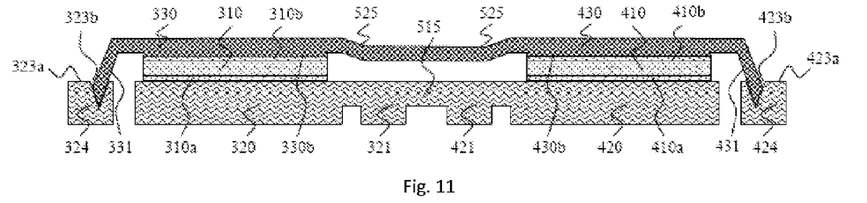
Figure 12:
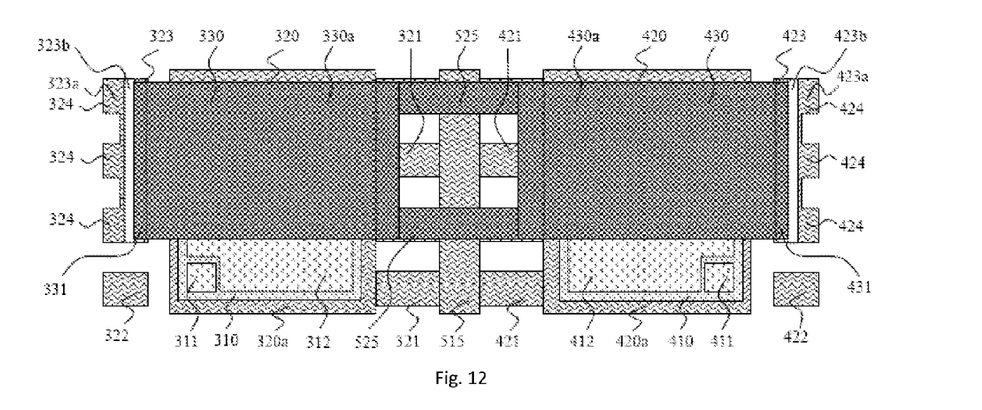

Referring to FIGS. 11 and 12, a first metal plate 330 is bonded on the first source metal layer 312 disposed on the top face of the first chip 310 using conductive adhesive material 310b and a second metal plate 430 is bonded on the second source metal layer 412 disposed on the top face of the second chip 410 using conductive adhesive material 410b. As the first and second metal plates 330 and 430 are connected with each other by connecting bars 525, the process of bonding the first and second metal plates 330 and 430 respectively on the first and second source metal layers 312 and 412 may be carried out simultaneously. FIG. 12 is a schematic top view after the attachment of the first and second metal plates 330 and 430 is accomplished. In this process, a first bent extension 331 of the first metal plate 330 is inserted into the first groove 323b of the first source lead 323 and a second bent extension 431 of the second metal plate 430 is inserted into the second groove 423b of the second source lead 423 simultaneously. One effective way to ensure the first and second extended structures 331 and 431 are respectively tightly attached to the first and second grooves 323b and 423b while maintaining well electrical connection is to respectively bond the first and second metal plates 330 and 430 respectively on the first and second source metal layers 312 and 413 and at the same time press the first and second metal plates 330 and 430 with an external force on the top 330a of the first metal plate 330 and the top 430a of the second metal plate 430 in such a manner that the first and second extended structures 331 and 431 are respectively in physical contact with at least one of the sidewalls of the first and second grooves 330b and 430b. To avoid die crack of the first and second chips 310 and 410, the magnitude of such external force should be controlled well under a safety threshold. Another effective way is to respectively bond and electrically connect the first and second extended structures 331 and 431 with the first and second source leads 323 and 423 through conductive adhesive materials (not shown) disposed in the first and second grooves 323b and 423b. The measures as mentioned above fix the positions of the first and second metal plates 330 and 430 and prevent them from sliding to cause shift in the subsequent processing steps.

Figure 14:
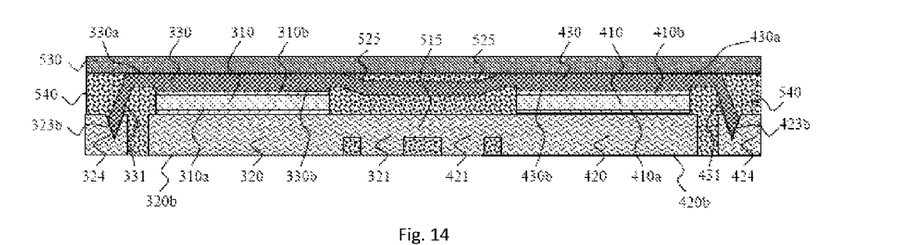

In FIGS. 11 and 14, the first and second metal plates 330 and 430 each has a downward step portion providing a bottom surface bonded onto the first source metal layer 312 and the second source metal layer 412 respectively. The first metal plate 330 bonded on the first chip 310 and the second metal plate 430 bonded on the second chip 410 form a mirror image to each other.

Figure 13:
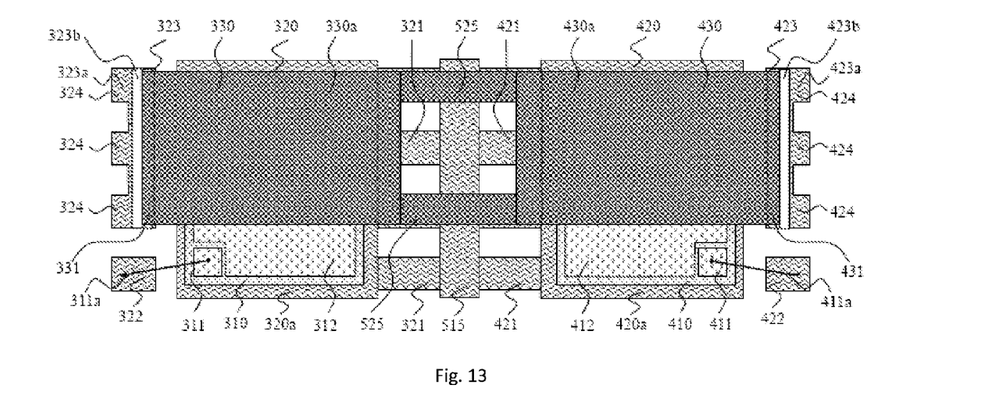

Referring to FIG. 13, a wire bonding process is implemented. The first gate metal layer 311 is connected with the first gate lead 322 using a wire 311a and the second gate metal layer 411 is connected with the second gate lead 422 using a wire 411a.

Referring to FIG. 14, the top face 330a of the first metal plate 330 and the top face 430a of the second metal plate 430 are covered and adhered by a film 530 prior to the implementation of a molding process in a mold chase.

The lead frame 510, the first chip 310, second chip 410, first metal plate 330, second metal plate 430 and wires 311a and 411a are plastic packaged and encapsulated with a molding compound 540. The film 530 is then removed such that the top face 330a of the first metal plate 330 and the top face 430a of the second metal plate 430 are exposed out from the molding compound 540.

Figure 15:
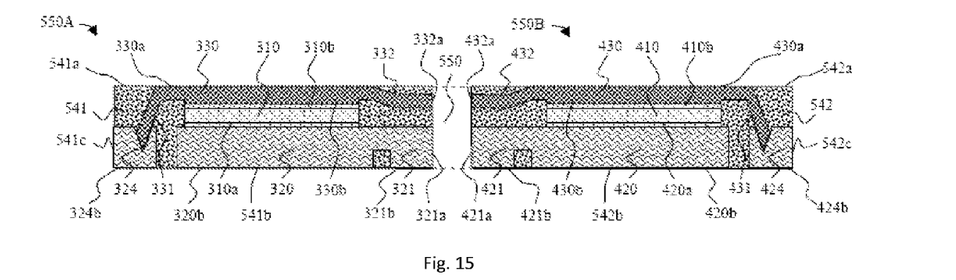

Referring to FIG. 15, the connecting bars 525 are cut off to separate a first connecting bar portion 332 connected on the first metal plate 330 from a second connecting bar portion 432 connected on the second metal plate 430 in the following sawing process. The dicing area 550 also cuts through and removes completely the tie bar 515 resulting in two packaged devices 550A and 550B respectively as a mirror image of each other. The tie bars 515, 516 and 517 are all cut off in the sawing process and the plastic molding body 540 is divided into a first portion 541 forming the encapsulation of packaged device 550A and a second portion 542 forming the encapsulation of packaged device 550B.

In the package 550A the top face 330a of the first metal plate 330 is exposed out from a top face 541a of the first plastic package body 541 and a side surface 324a of the first source pin 324 is exposed on a sidewall surface 541c, a side surface 322a of the first gate lead 322 is exposed on the sidewall surface 541c and a side surface 321a of the first drain lead 321 is exposed on a sidewall surface 541d opposite to sidewall surface 541c. In package 550B, the top face 430a of the second metal plate 430 is exposed from the top face 542a of the second plastic package body 542 and a side surface 424a of the second source pin 424 is exposed on a sidewall surface 542c, a side surface 422a of the second gate lead 422 is exposed on the sidewall surface 542c and a side surface 421a of the second source lead 421 is exposed on a sidewall surface 542d opposite to the sidewall surface 542c. Further, the dicing surface 332a of the first connecting bar portion 332 is exposed on the sidewall surface 541d and the dicing surface 432a of the second connecting bar portion 432 is exposed on the side surface 542d.

Figure 16:
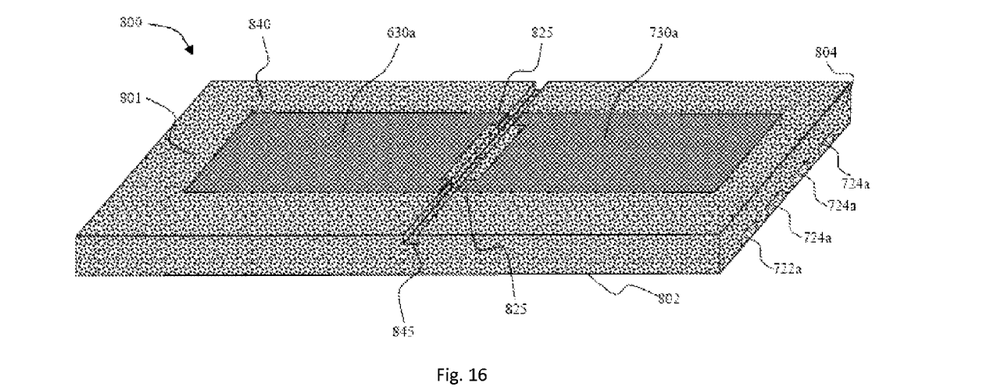
FIG. 16 is a perspective top view of a package in accordance with a second embodiment of the present invention.
Figure 17:
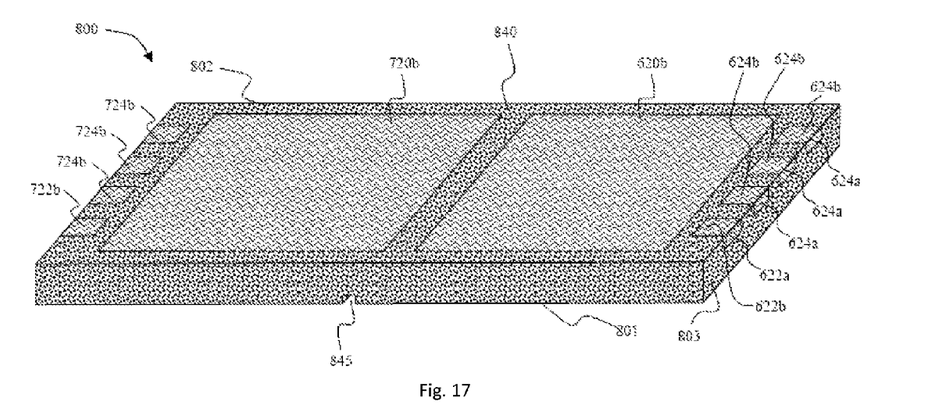
FIG. 17 is a perspective bottom view of the package in accordance with the second embodiment of the present invention.
Figure 18:
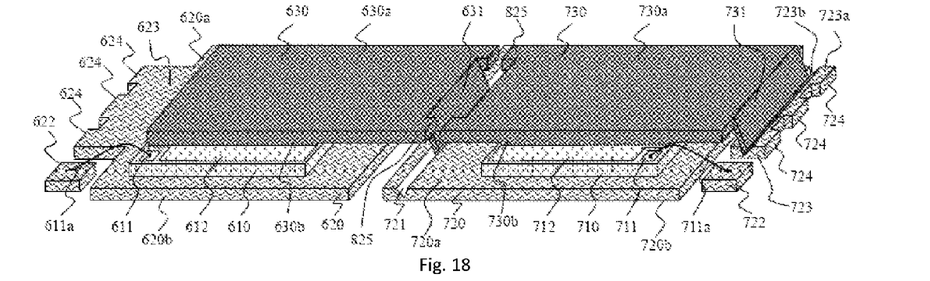
FIG. 18 is a perspective structure diagram of the package in accordance with the second embodiment of the present invention.

Second Embodiment:

Referring to FIGS. 16 to 18, in a package 800 the top face 630a of a first metal plate 630 is exposed from the top 801 of a plastic package body 840 and the bottom 620b of a first die pad 620 is exposed out from a bottom 802 of the plastic package body 840; the top face 730a of a second metal plate 730 is exposed from the top face 801 of the plastic package body and the bottom 720b of a second die pad 720 is exposed from the bottom of the plastic package body 840. A shallow groove 845 disposed on the top face 801 of the plastic package body 840 cutting through a plurality of connecting bars 825 connecting the first metal plate 630 and the second metal plate 730 therefore separates the first metal plate 630 and the second metal plate 730.

Figure 19:
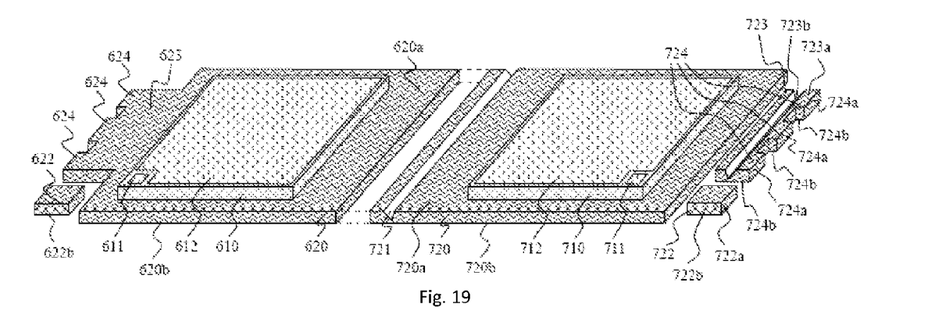
FIG. 19 is a structure diagram of a first chip attached on a first die pad, and a second chip attached on the second lead frame in accordance with the second embodiment of the present invention.

Referring to FIG. 19, a first plurality of leads comprising a drain lead 623 and a first gate lead 622 are disposed on the circumference of the first die pad 620 and the drain lead 623 is connected with the first die pad 620; a second plurality of the leads comprising a source lead 723 and a second gate lead 722 are disposed on the circumference of the second die pad; a first groove having substantially a V-shaped structure is disposed on a top face 720a of the second die pad 720 and a second groove 723b having substantially a V-shaped structure is disposed on a top face 723a of the source lead 723; a bottom of first chip 610 is attached to a top face 620a of the first die pad 620 by a conductive adhesive material (not shown), a bottom of second chip 710 is attached to a top face 720a of the second die pad by a conductive adhesive material (not shown) and the conductive adhesive materials are typically of the solder paste or epoxy type.

In FIGS. 18 and 19, the first and second chips 610 and 710 are metal-oxide-semiconductor field-effect transistors (MOSFET) having vertical device structures; the top face of the first chip 610 is provided with a first gate metal layer 611 and a first source metal layer 612 constituting respectively as a gate electrode and a source electrode of the first chip 610 which are insulated from each other by a passivation layer; a drain electrode of the first chip 610 is disposed on the bottom of the first chip 610; the top of the second chip 710 is provided with a second gate metal layer 711 and a second source metal layer 712 constituting respectively as a gate electrode and a source electrode of the second chip 710 which are insulated from each other by a passivation layer, a drain electrode of the second chip 710 is disposed on the bottom of the second chip 710; wherein, the first chip 610 is a high side MOSFET, while the second chip 710 is a low side MOSFET.

In FIGS. 18 and 19, the first metal plate 630 is provided with a first bent extension 631, a bottom face 630b of the first metal plate 630 is bonded with the first source metal layer 612 disposed on the top of the first chip 610 by a conductive adhesive material of solder paste or silver epoxy type (not shown) and the first bent extension 631 is disposed in the first V groove 721 on the top face 720a of the second die pad 720 in such a manner that the first bent extension 631 may be bonded with the second die pad 720 using a conductive adhesive material of the solder paste or epoxy type (not shown) to enhance the electrical contact performances between them. The first gate metal layer 611 may be electrically connected with the first gate lead 622 by a bonding wire 611a. The second metal plate 730 is provided with a second bent extension 731. A bottom 730b of the second metal plate 730 is bonded to the second source metal layer 712 disposed on the top of the second chip 710 by a conductive material of the solder paste or silver epoxy type (not shown) and the second bent extension 731 is disposed in the second groove 721 disposed on the top face 723a of the source lead 723 in such a manner that the second bent extension 731 may be bonded with the source lead 723 using a conductive adhesive material of the solder paste or epoxy type (not shown) to enhance the electrical contact performances between them. The second gate metal layer 711 may be electrically connected with the second gate lead 722 by a bonding wire 711a. Therefore the source electrode of the first chip 610 is electrically connected to the drain electrode of the second chip 710 by the conductive first metal plate 630, the first bent extension 631 and the second die pad 720.

Figure 20:
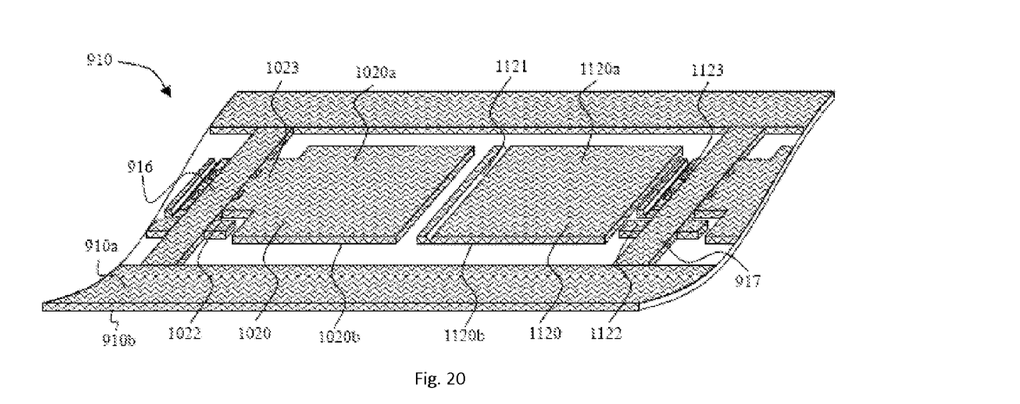
FIG. 20 is a schematic diagram illustrating the structure of a lead frame array in accordance with the second embodiment of the invention.

In FIGS. 16 to 19, the plastic package body 840 formed by solidified epoxy molding compound encapsulates the first chip 610, second chip 710, first die pad 620, second die pad 720, first metal plate 630, second metal plate 730 and wires 611a and 711a, and also the first plurality of leads including the drain lead 623 and first gate lead 622 and the second plurality of leads including the source lead 723 and second gate lead 722. The source lead 723 is provided with a plurality of source pins 724 and the drain lead 623 is provided with a plurality of drain pins 624. As shown in FIGS. 17 and 18, the bottoms 724b of two adjacent source pins 724 are isolated from each other and the bottoms 624b of two adjacent drain pins 624 are isolated from each other; the bottoms 724b of two adjacent source pins 724 are exposed out from the bottom 802 of the plastic package body 840 and the bottom 622b of the first gate lead 622, the bottom 722b of the second gate lead 722 and the bottoms 624b of the drain pins 624 are all exposed out from the bottom 802 of the plastic package body 840. A side surface 724a of the source pin 724 and a side surface 622a of the second gate lead 622 are exposed on a side surface 804 of the plastic package body 840 and a side surface 624a of the drain pin 624 and a side surface 622a of the first gate lead 622 are exposed on another side surface 803 of the plastic package body 840 which is opposite to the side surface 804. The small area and thickness of the plastic package body 800 can be more effectively maintained as no pins extend out from it. The bottom 620b of the first die pad 620 and the bottom 720b of the second die pad 720 when soldered onto a PCB with the SMT technique serve as heat dissipation channels of the first and second chips 610 and 710 and the top 630a of the first metal plate 630 and the top 730a of the second metal plate 730 are exposed and thus can also serve as a way for the first and second chips 610 and 710 to dissipate heat. As inside the package 800 the conductive paths between the first and second chips 610 and 710 and the leads of the first and second pluralities are short and the coefficient of self-induction and wiring resistance inside the package 800 are both small, the package 800 can provide excellent electrical properties Referring to FIGS. 20 to 30 for a process of assembling the package, as shown in FIG. 20, a lead frame array 910 comprises a plurality of lead frame unit 920 shown in FIG. 21 each comprising a first die pad 1020, a second die pad 1120, a first plurality of leads disposed on the circumference of the first die pad 1020 and a second plurality of leads disposed on the circumference of the second die pad 1120. The first plurality of leads comprise a first gate lead 1022 and a drain lead 1023 connected with the first die pad 1020; the second plurality of leads comprise a second gate lead 1122 and a source lead 1123; both the first gate lead 1022 and drain lead 1023 are connected with the an uncut tie bar 916 of the lead frame 910 and both the second gate lead 1122 and source lead 1123 are connected with the an uncut tie bar 917 of the lead frame array 910; the second die pad 1120 is connected to the lead frame array 910 by other uncut tie bars not shown.

Figure 21:
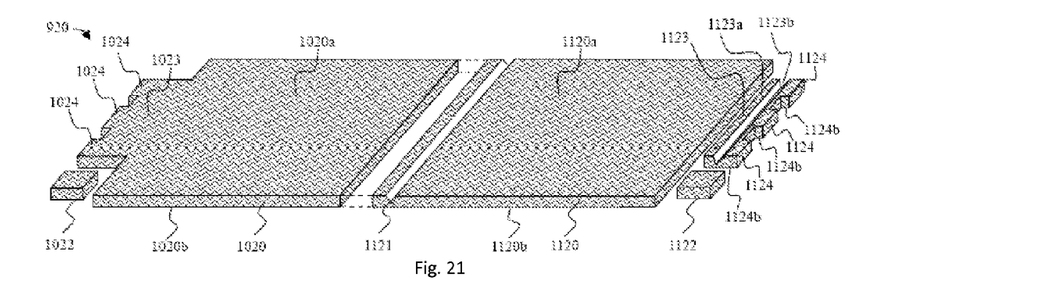
FIG. 21 is a structure diagram of a lead frame unit for the package in accordance with the second embodiment of the invention.
Figure 22:
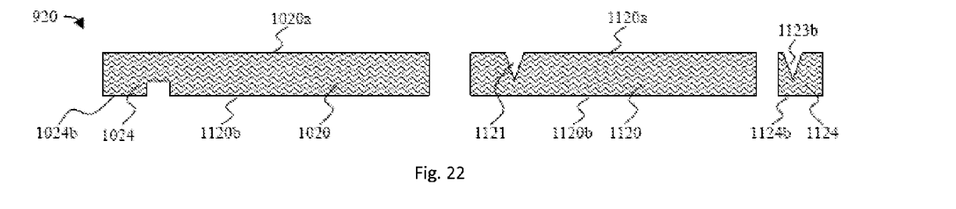
FIGS. 22-30 are schematic diagrams illustrating the manufacturing process flows of the package in accordance with the second embodiment of the invention.
Figure 23:
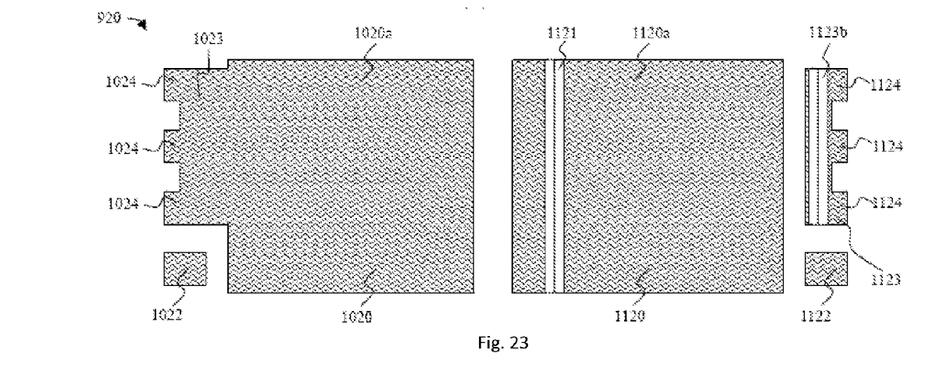

FIG. 22 is a schematic cross section of the lead frame unit 920 and FIG. 23 is a schematic top view of the lead frame unit 920. In FIGS. 21 to 23, the source lead 1123 is provided with a plurality of source pins 1124 and a second groove 1123b having substantially a V-shaped structure is disposed on the top face 1123a of the source lead 1123; wherein, the bottoms 1124b of two adjacent source pins 1124 are isolated from each other; a first groove 1121 having substantially a V-shaped structure is disposed on a top 1120a of the second die pad 1120; the drain lead 1023 is provided with a plurality of drain pins 1024; wherein, the bottoms 1024b of two adjacent drain pins 1024 are isolated from each other.

In FIGS. 20 and 21, a top face 1020a of the first die pad 1020 and a top face 1120a of the second die pad 1120 are disposed at a front surface 910a of the lead frame 910 and a bottom 1020b of the first die pad 1020 and a bottom 1120b of the second die pad 1120 are disposed at a back surface 910b of the lead frame 910. Typically, the lead frame 910 is provided with an attach film (not shown) bonded on its back surface 910b and the bottom 1020b of the first die pad 1020 and the bottom 1120b of the second die pad 1120 are also bonded on the attach film to protect them from being polluted or damaged. In FIGS. 22 and 23, the bottoms 1024b of the drain pins 1024, the bottom of the first gate lead 1022 (not shown), the bottoms 1124b of the first source pins 1124, the bottom 1121b of the second drain lead 1121 (not shown), the bottom 1020b of the first die pad 1020 and the bottom 1120b of the second die pad 1120 are in the same plane, that is, they are also attached to the above-mentioned attach film disposed on the back surface 910 of the lead frame 910.

Figure 24:
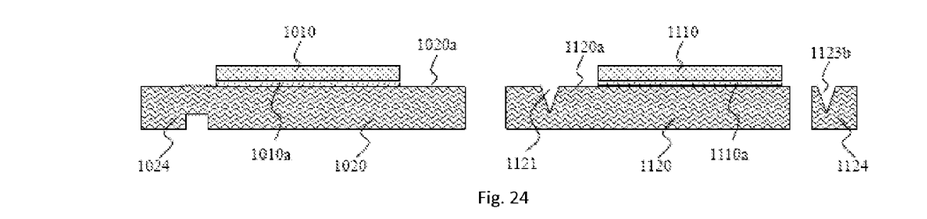
Figure 25:
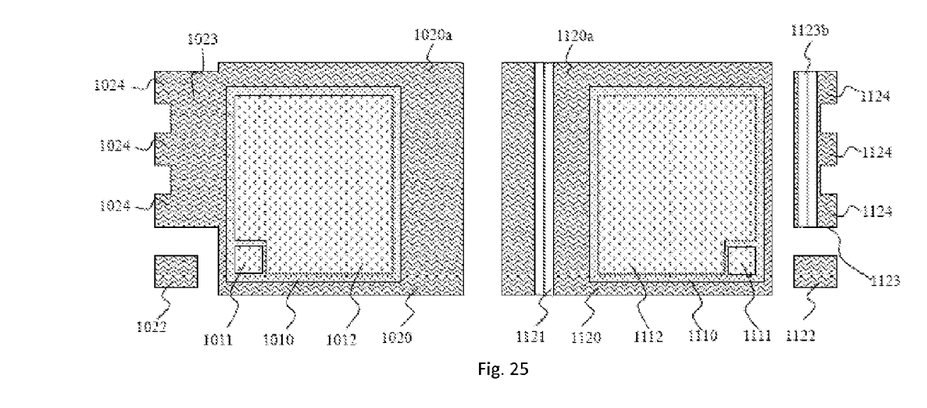
Figure 26:
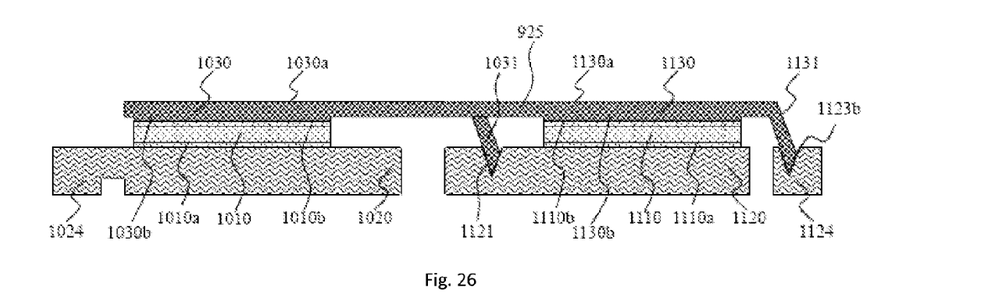

Referring to FIG. 26, a die attach process is implemented. A first chip 1010 is bonded to the die pad on the top 1020a of the first die pad 1020 using a conductive adhesive material 1010a, a second chip 1110 is bonded to the die pad on the top 1120a of the second die pad 1120 by using a conductive adhesive material 1110a. FIG. 25 is a schematic top view of the lead frame unit with die attach completed. In FIGS. 24 and 25, both the first chip 1010 and second chip 1110 are vertical MOSFET devices with a first source metal layer 1012 constitutes a source electrode of the first chip 1010 and the bottom of the first chip 1010 attached to the first die pad 1020 constitutes a drain electrode of the first chip 1010; a second source metal layer 1112 constitutes a source electrode of the second chip 1110 and the bottom of the second chip 1110 attached to the second die pad 1120 constitutes a drain electrode of the second chip 1110. A wire bonding pad comprising a first gate metal layer 1011 constituting a gate electrode of the first chip 1010 is disposed on the top of the first chip 1010 and a wire bonding pad comprising a second gate metal layer 1111 constituting a gate electrode of the second chip 1110 is disposed on the top of the second chip 1110. The first chip 1010 is a high side MOSFET, while the second chip 1110 is a low side MOSFET.

Figure 27:
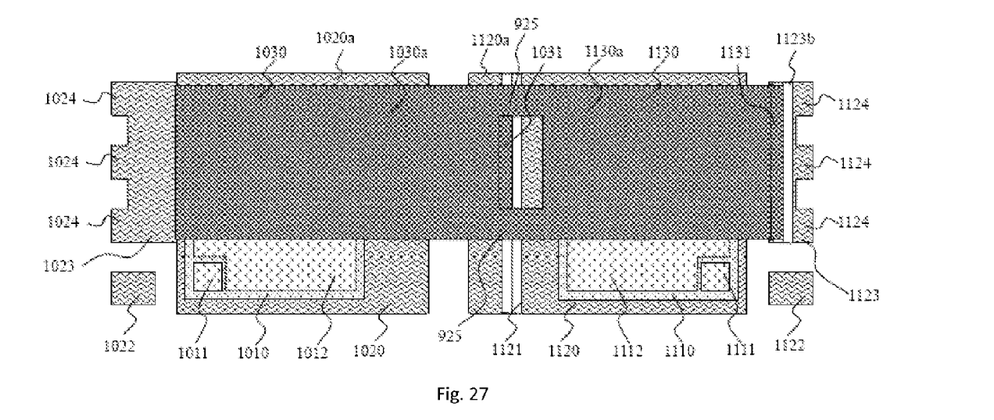

Referring to FIGS. 26 and 27, a first metal plate 1030 is bonded on the first source metal layer 1012 disposed on the top of the first chip 1010 using a conductive adhesive material 1010b and a second metal plate 1130 is bonded on the second source metal layer 1112 disposed on the top of the second chip 1110. As the first and second metal plates 1030 and 1130 are connected with each other by a connecting bar 925, bonding the first and second metal plates 1030 and 1130 respectively on the first and second source metal layers 1012 and 1112 is performed simultaneously. FIG. 27 is a schematic top view after the attachment of the first and second metal plates 1030 and 1130 is accomplished. In such process, a first bent extension 1031 provided with the first metal plate 1030 is inserted into the first groove 1023b and simultaneously a second bent extension 1131 provided with the second metal plate 1130 is inserted into the second groove 1123b. One effective way to ensure that the first and second extended structures 1031 and 1131 are respectively tightly attached to and maintain good electrical connection with the first and second grooves 1023b and 1123b is to respectively bond the first and second metal plates 1030 and 1130 on the first and second source metal layers 1012 and 1113 and then press the first and second metal plates 1030 and 1130 with an external force on the top 1030a of the first metal plate 1030 and the top 1130a of the second metal plate 1130 in such a manner that the first and second bent extended structures 1031 and 1131 are inserted into the first and second grooves 1030b and 1130b and respectively in physical contact with at least one of the V groove sidewalls. To avoid die crack of the first and second chips 1010 and 1110 the magnitude of such external force is not desirable to be very large. Another effective way is to respectively bond and electrically connect the first and second extended structures 1031 and 1131 with the second die pad 1120 and second source lead 1123 through conductive adhesive materials (not shown) disposed in the first and second grooves 1023b and 1123b.

In FIGS. 26 and 27, the first and second metal plates 1030 and 1130, each has a downward step portion providing a bottom surface bonded on the first source metal layer 1012 and the second source metal layer 1112 respectively.

Figure 28:
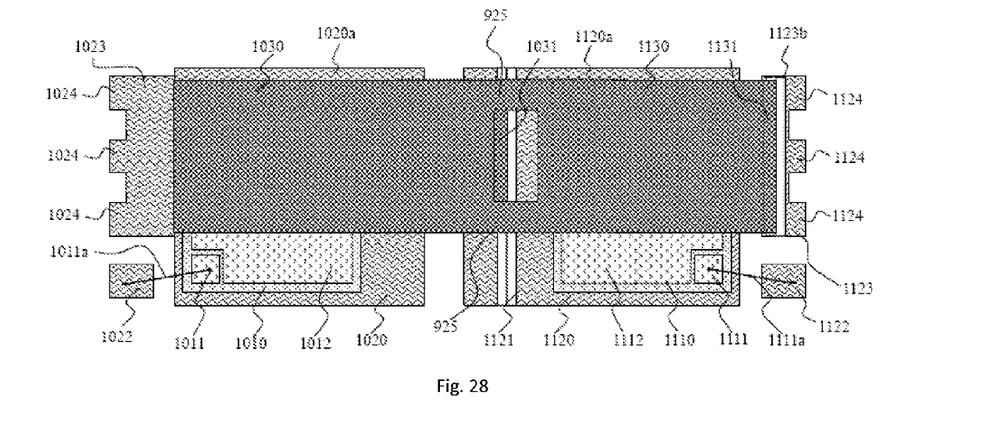

Referring to FIG. 28, a wire process is implemented. The first gate metal layer 1011 is bonded with the first gate lead 1022 using a bond wire 1011a and the second gate metal layer 1111 is bonded with the second gate lead 1122 using a bond wire 1111a.

Figure 29:
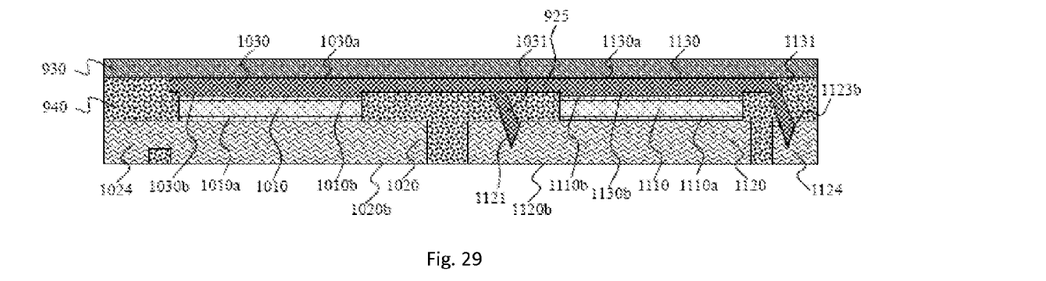

Referring to FIG. 29, the top face 1030a of the first metal plate 1030 and the top face 1130a of the second metal plate 1130 are covered and adhered by a film 930 prior to the implementation of the molding process using film assisted molding technology. The lead frame array 910, the first chip 1010, the second chip 1110, the first metal plate 1030, the second metal plate 1130 and the wires 1011a and 1111a are packaged and encapsulated with a molding compound 940 to form a plurality of package units 1050 each comprising the lead frame unit 920, first chip 1010, second chip 1110, first metal plate 1030, second metal plate 1130 and bond wires 1011a and 1111a plastic packaged and encapsulated by the molding compound 940. The film 930 is removed after the molding process is completed such that the top face 1030a of the first metal plate 1030 and the top face 1130a of the second metal plate 1130 are exposed out from the molding compound 940.

Figure 30:
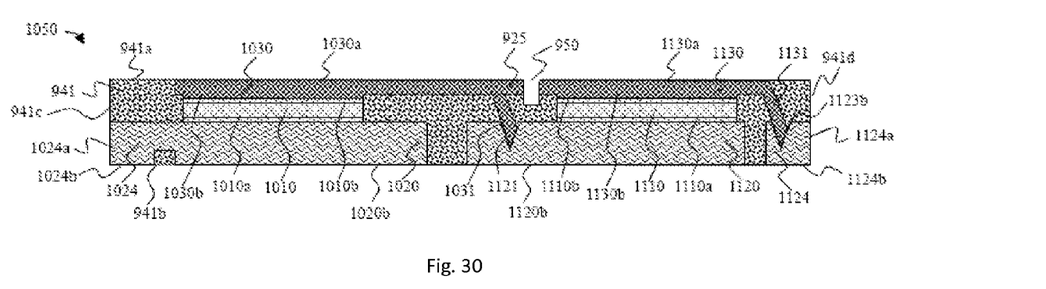

Referring to FIG. 30, the connecting bar 925 as shown in FIG. 28 is cut off and simultaneously a dicing groove 950 dividing the first and second metal plates 1030 and 1130 is formed on the molding compound 940. Then a package sawing process is implemented. The molding compound 940 and the lead frame array 910 are diced to separate the package unit 1050 from the lead frame array 910 with a package molding portion 941 as shown in FIGS. 30.

In the process of forming the package units 1050 the top face 1030a of the first metal plate 1030 and the top face 1130a of the second metal plate 1130 are exposed out from the top face 941a of the plastic package body 941. Further a side surface 1024a of the drain pin 1024, a side surface 1022a of the first gate lead 1022 are exposed on a side surface 941c of the plastic package body 941, and a side surface 1124a of the source pin 1124 and a side surface 1122a of the second gate lead 1122 are exposed on a side surface 941d of the plastic package body 941 opposite to the side surface 941c.

In the processing steps as mentioned above, after the molding process is completed, the film (not shown) attached to the bottom of lead frame array is stripped away from the back surface 910b of the lead frame array 910. The bottom surfaces 1124b of the source pins, the bottom surfaces 1024b of the drain pins, the bottom of the first gate lead 1022 (not shown), the bottom of the second gate lead 1122 (not shown), the bottom face 1020b of the first die pad and the bottom face 1120b of the second die pad are all exposed out from the molding compound 940, that is, the bottom 941b of plastic package body 941. The first and second chips 1010 and 1110 in the package unit 1050 are connected as a high side MOSFET and a low side MOSFET, which constitute a DC/DC synchronizing rectifier circuit to be driven by a driver. The exposed tops 1030a and 1130a and the bottoms 1020b and 1124b of the package unit 1050 ensure it has favorable heat dissipation performances.

The semiconductor package provided by this invention improves the thermal dissipation and parasitic resistance and inductance. The assembly methods reduce the cost of high performance semiconductor package production. It is apparent that the above embodiments may be altered in many ways without departing from the scope of the invention. Further, various aspects of a particular embodiment may contain patentable subject matter without regard to other aspects of the same embodiment. Still further, various aspects of different embodiments can be combined together. Accordingly, the scope of the invention should be determined by the following claims and their legal equivalents.

The invention claimed is:
1. A semiconductor package comprising:
a lead frame having a first die pad, a first source lead and a first gate lead separated but near the first die pad, wherein the first source lead has a V groove disposed on a top surface of the first source lead, and wherein two sidewalls of the V groove of the first source lead are terminated substantially on a same plane coplanar to the top surface of the first source lead;
a first semiconductor chip having a source electrode and a gate electrode on a top surface of the first semiconductor chip and a drain electrode on a bottom surface of the first semiconductor chip, wherein the first semiconductor chip is disposed on the first die pad, and wherein the drain electrode of the first semiconductor chip is electrically attached to a top surface of the first die pad through a conductive adhesive;
a first metal plate with a first bent extension, wherein a bottom face of the first metal plate is electrically attached to the source electrode of the first semiconductor chip, wherein the first bent extension is terminated in the V groove of the first source lead, and wherein the first bent extension is in contact with at least one of the V groove sidewalls of the first source lead;
a first bond wire electrically connecting the gate electrode of the first semiconductor chip to the first gate lead of the lead frame; and a molding plastic encapsulating the first semiconductor chip, the first metal plate, the first bond wire and the lead frame with a bottom face of the lead frame exposed on a bottom surface of the molding plastic.

2. The semiconductor package of claim 1 wherein the V groove has symmetric sidewalls.

3. The semiconductor package of claim 1 wherein an end face of a portion of an end of the first metal plate opposite to the first bent extension is exposed from a middle portion of a side surface of the molding plastic opposite to an exposed side surface of the first source lead.

4. The semiconductor package of claim 1 wherein a top face of the first metal plate is exposed on a top surface of the molding plastic.

5. The semiconductor package of claim 1 further comprising a second semiconductor chip having a source electrode and a gate electrode on a top surface of the second semiconductor chip and a drain electrode on a bottom surface of the second semiconductor chip, wherein the second semiconductor chip is disposed on a second die pad of the lead frame, and wherein the drain electrode of the second semiconductor chip is electrically attached to a top surface of the second die pad through another conductive adhesive.

6. The semiconductor package of claim 5 wherein the first source lead extends to an area constituting the second die pad for the second semiconductor chip disposed thereon.

7. The semiconductor package of claim 5 wherein the lead frame further comprises a second source lead and a second gate lead separated but near the second die pad, wherein the second source lead has a V groove disposed on a top surface of the second source lead, and wherein two sidewalls of the V groove of the second source lead are terminated substantially on a same plane coplanar to the top surface of the second source lead.

8. The semiconductor package of claim 7 further comprising a second metal plate with a second bent extension, wherein a bottom face of the second metal plate is electrically attached to the source electrode of the second semiconductor chip, wherein the second bent extension is terminated in the V groove of the second source lead, and wherein the second bent extension is in contact with at least one of the V groove sidewalls of the second source lead.

9. The semiconductor package of claim 8 further comprising a second bond wire electrically connecting the gate electrode of the second semiconductor chip to the second gate lead of the lead frame.

10. The semiconductor package of claim 9 wherein the molding plastic further encapsulates the second semiconductor chip, the second metal plate, and the second bond wire.

11. The semiconductor package of claim 10 wherein a top face of the second metal plate is exposed on a top surface of the molding plastic.

12. The semiconductor package of claim 11 wherein a top face of the first metal plate is exposed on the top surface of the molding plastic.

* * * * *